(12) United States Patent
You et al.

(10) Patent No.: US 7,651,739 B2
(45) Date of Patent: Jan. 26, 2010

(54) SURFACE TREATMENT METHOD OF FIBER REINFORCED PLASTIC SUBSTRATE

(75) Inventors: In Kyu You, Daejeon (KR); Seung Youl Kang, Daejeon (JP); Seong Deok Ahn, Daejeon (KR); Gi Heon Kim, Daejeon (KR); Ji Young Oh, Daejeon (JP); Chul Am Kim, Seoul (KR); Kyu Ha Baek, Daejeon (KR); Kyung Soo Suh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 684 days.

(21) Appl. No.: 11/450,169

(22) Filed: Jun. 8, 2006

(65) Prior Publication Data

US 2007/0082138 A1  Apr. 12, 2007

(30) Foreign Application Priority Data

Oct. 10, 2005  (KR) .................... 10-2005-0094823

(51) Int. Cl.
*B05D 3/02* (2006.01)
*B05D 3/00* (2006.01)
*B05D 1/18* (2006.01)
*B08B 3/10* (2006.01)

(52) U.S. Cl. .................. 427/384; 427/299; 427/307; 427/331; 427/372.2; 427/430.1; 134/26

(58) Field of Classification Search .............. 427/430.1, 427/299, 314
See application file for complete search history.

(56) References Cited

U.S. PATENT DOCUMENTS

| 3,065,109 | A | * | 11/1962 | Hensley ...................... 428/483 |
| 4,724,173 | A | * | 2/1988 | Rockett et al. ............ 427/389.8 |
| 4,737,403 | A | * | 4/1988 | Simpson et al. ............. 428/415 |
| 5,232,750 | A | * | 8/1993 | Onodera et al. ............. 427/560 |
| 6,066,197 | A | * | 5/2000 | Bristol et al. ............ 106/14.42 |
| 6,090,464 | A | | 7/2000 | Yoo |
| 6,207,077 | B1 | * | 3/2001 | Burnell-Jones ........ 252/301.36 |
| 6,592,969 | B1 | | 7/2003 | Burroughes et al. |
| 2004/0079940 | A1 | | 4/2004 | Redecker et al. |

* cited by examiner

*Primary Examiner*—David Turocy
(74) *Attorney, Agent, or Firm*—Blakely, Sokoloff, Taylor & Zafman LLP

(57) ABSTRACT

A surface treatment method of an FRP substrate is provided. According to the method, an FRP substrate that is less deformed than a conventional flexible substrate material is used, and surface roughness, which is a drawback of the FRP substrate, is improved so that it may be applied to the fabrication of a device. In order to reduce the surface roughness of an FRP substrate, the FRP substrate is coated with an organic insulating solution and thereby planarized. Due to the reduced deformation and superior flatness, failures occurring due to misalignment in a photolithography process may be prevented.

7 Claims, 5 Drawing Sheets

SURFACE TREATMENT METHOD OF FIBER REINFORCED PLASTIC SUBSTRATE

CROSS-REFERENCE TO RELATED APPLICATION

This application claims priority to and the benefit of Korean Patent Application No. 2005-94823, filed on Oct. 10, 2005, the disclosure of which is incorporated herein by reference in its entirety.

BACKGROUND

1. Field of the Invention

The present invention relates to a fiber reinforced plastic (FRP) substrate applied to a flexible electronic device, and more particularly, to a surface treatment method of an FRP substrate which can improve surface flatness and prevent failures due to misalignment in a process of fabricating a device.

2. Discussion of Related Art

Flexible electronic devices have been the focus of considerable attention and world-wide studied since the mid-1990s. Flexible electronic devices are applied in various fields, such as in attachable displays, advertising displays, large portable displays, and the like. The leading applications are electronic paper and organic light emitting devices (OLEDs), and a field of applications using organic thin film transistors is on the forefront of development.

As an interest in flexible electronic devices increases, research into some materials as flexible substrate is progressing. Exemplary materials used for a flexible substrate are polyether sulfone (PES), poly ethylene tertraphthalate (PET), poly ethylene naphthalate (PEN), poly imide (PI), poly carbonate (PC), and the like. These materials, as shown in the following Table 1, have a relatively high glass transition temperature (Tg) in the range of about 150-220° C., and a coefficient of thermal expansion (CTE) of about 15-70 ppm/° C. (@ 55-85° C.).

TABLE 1

| | polymer | | | |
| --- | --- | --- | --- | --- |
| | PC | PES | PI | FRP |
| CTE(−55–85° C.)/ppm/° C. | 60–70 | 54 | 30–60 | 12–14 |
| Young's modulus/GPa | 1.7 | 2.2 | 2.5 | 28–31 |

*GPa: Giga Pascal

However, in spite of these properties, there are many difficulties in using these materials as a substrate of a flexible electric device, because a substrate swelling, expansion, or shrinking while undergoing a photolithography process, a thermal process, a chemical process, and the like, in the manufacture of a practical electronic device.

FIG. 1 is a microscopic photograph showing a state of alignment of a mask and a PC (polycarbonate) substrate 10, using a contact aligner for forming a metal gate contact pattern. An alignment mark 11 of a mask and an alignment mark 12 formed by PR (photo-resistive) film pattern on the substrate 10 are about 15 µm out of alignment. It was confirmed that such misalignment results from expansion of the substrate 10. When a series of organic electronic devices were fabricated using a PC substrate, a problem of the substrate expanding by about 15 µm per 5 cm section was confirmed. Such expansion was seen in a PES substrate as well.

FIG. 2 is a microscopic photograph showing a state of alignment of a mask and a PES substrate 20, aligned using a contact aligner for forming a metal gate contact pattern. An alignment mark 21 of a mask and an alignment mark 22 formed by PR film pattern on the substrate 20 are about 20 µm out of alignment.

Accordingly, both PC and PES substrates have a problem of expansion by 15 µm or more per 5 cm. This problem can become quite serious when the substrates are actually used to form electronic devices. In order to form an organic flexible active-matrix OLED and electronic paper, while there is a slight variation depending on the complexity of the device to be formed, photolithography processes should be performed at least six times. However, when such misalignment happens, a device cannot be integrated, and in the case of an organic luminescent emitting display having a 5 cm panel, a part of the panel may not operate owing to misalignment.

Therefore, in order to easily form a fine pattern of a highly integrated device, a plastic substrate that does not expand, shrink or deform significantly should be used. However, plastic substrates currently being used do undergo deformation such as expansion and shrinking in a process of fabricating a device, and have very low surface smoothness, therefore making them difficult to employ in device manufacture.

SUMMARY OF THE INVENTION

The present invention is directed to providing a surface treatment method of a fiber reinforced plastic (FRP) substrate for fabricating a device.

The present invention is also directed to providing a surface treatment method of an FRP substrate for improving surface smoothness of the FRP substrate and preventing failures due to misalignment in a photolithography process.

According to one aspect of the invention, there is provided a surface treatment method of an FRP substrate, comprising: cleaning the FRP substrate; removing residue from the surface of the FRP substrate; coating the FRP substrate with an organic insulating solution and planarizing the surface thereof; and baking the organic insulating solution.

The step of cleaning the FRP substrate may comprise: cleaning the FRP substrate with a mixed solution of neutral detergent and de-ionized water; cleaning the FRP substrate with de-ionized water and removing organic substances and particles sticking to its surface; cleaning the FRP substrate with a mixed solution of de-ionized water and IPA and removing partially remaining organic substances and inorganic substances; dipping the FRP substrate in IPA and removing partially remaining inorganic substances; and drying the FRP substrate.

The step of planarizing the substrate may comprise dipping the FRP substrate in an organic insulating solution and lifting it out of the organic insulating solution at constant speed.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

An FRP substrate has the advantages of being less deformed, i.e., less expanded or shrinked, and being flexible. However, it is difficult to apply it to the fabrication of a practical device owing to low surface smoothness. The invention, by enhancing surface smoothness through surface treatment, makes the FRP substrate applicable to the fabrication of flexible displays, flexible electronic devices, fine flexible organic electronic devices, and flexible active OLEDs using the fine flexible organic electronic devices as driving devices.

Hereinafter, exemplary embodiments of the present invention will be described in detail. However, the present invention is not limited to the exemplary embodiments disclosed below, but can be implemented in various modified forms. Therefore, the exemplary embodiments are provided for complete disclosure of the present invention and to fully inform the scope of the present invention to those of ordinary skill in the art.

Figure 3:
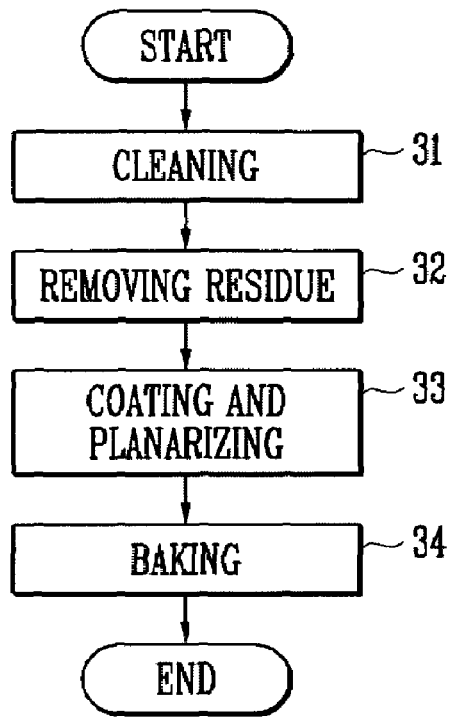
FIG. 3 is a flowchart illustrating a surface treatment method of an FRP substrate according to the present invention.

FIG. 3 is a flowchart illustrating a surface treatment method of an FRP substrate according to the present invention.

Cleaning (Step 31)

An FRP substrate is cleaned. The present exemplary embodiment of the invention uses an FRP substrate that is 100 µm thick, and an example of the cleaning step is as follows.

First, the FRP substrate is cleaned for about 5 to 10 minutes with a mixed solution of neutral detergent and de-ionized water in a ratio of 1:5. The cleaned FRP substrate is cleaned for 5 to 10 minutes with de-ionized water in an ultrasonic washer so that organisms or particles, sticking to the surface due to static electricity, are removed. In order to remove partially remaining organic and inorganic substances, the substrate is cleaned for 5 to 10 minutes with a mixed solution of de-ionized water and IPA in equal ratio. Also, the FRP substrate is dipped in IPA for 5 to 10 minutes so as to remove remaining inorganic substances, and then oven-dried for 10 minutes at 100° C.

Removing Residue (Step 32)

The substrate is heat-treated in an oven for 24 to 48 hours in a vacuum and at a temperature of 100 to 180° C., and preferably 150° C. Volatile residue materials are removed by this heat treatment. When materials such as water, any sort of organisms, gas compounds and the like remain on the surface of the FRP substrate, they may affect the properties of a device.

Coating and Flatness (Step 33)

A surface of the FRP substrate is planarized by coating the heat-treated FRP substrate with an organic insulating solution. Here, it is important that the organic insulating materials are evenly coated on the surface of the FRP substrate. In an exemplary embodiment of the invention, the FRP substrate is dipped for over 30 minutes in the organic insulating solution and then lifted out with a dipper (dragger) so that the organic insulating solution may be evenly coated on the surface of the FRP substrate. Here, when the FRP substrate is lifted up at a constant speed, surface smoothness may deteriorate, for example, patterns may be formed on the surface. This is why the substrate is preferably lifted up at a slow and constant speed, for example, at a constant speed of 0.1-1 mm/s. Alternatively, any other coating method that maintains surface smoothness may be applied in lieu of the dipping method. As the organic insulating solution, acryl-based JSS362 or JSS361 available from JSR Company can be used. Or, a polymer solution containing any of polyester, polycarbonate, polyvinylbuterate, polyethylene, polyamide, polysulphone, polyvinylacetylene, polyacrylate, and polyvinylalcohol, for example, may also be used as the organic insulating solution.

Baking (Step 34)

As described above, the FRP substrate coated with the organic insulating solution is baked by heat-treating in an oven for 30 minutes to 1 hour, in a vacuum and at a temperature of 100 to 180° C., and preferably 150° C.

Figure 4:
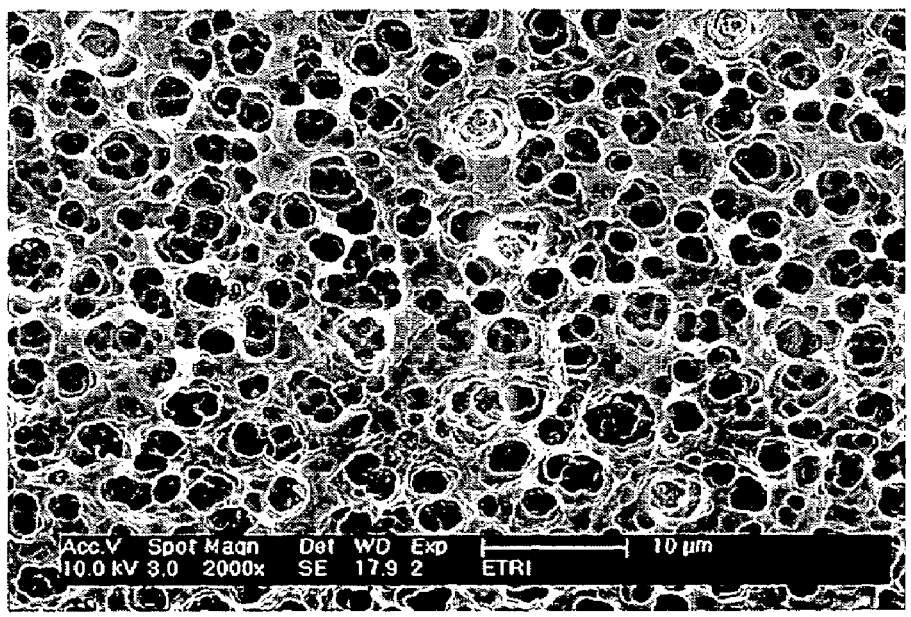
FIG. 4 is a scanning electron microscopic (SEM) photograph of the surface of an FRP substrate used in the present invention.

FIG. 4 is a scanning electron microscopic (SEM) photograph of the surface of an FRP substrate used in the invention, taken by SEM (scanning electron microscopy) at a magnification of 2,000. The concentration of color indicates that there are many pores of several µm on the substrate. Thus the surface of the substrate is very rough and coarse. Such surface roughness can cause misalignment in a photolithography process.

Figure 5:
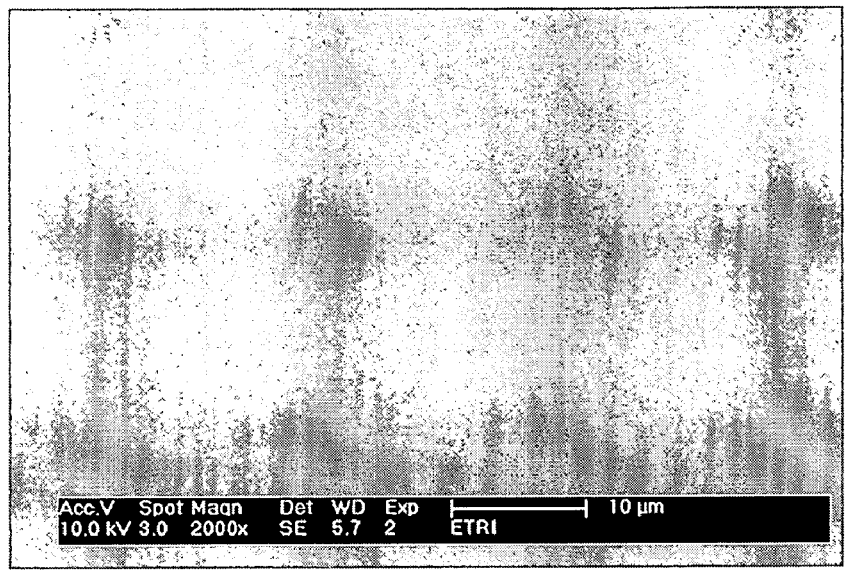
FIG. 5 is a scanning electron microscopic (SEM) photograph of the surface of an FRP substrate treated according to the present invention.

FIG. 5 is a scanning electron microscopic (SEM) photograph of an FRP substrate whose surface has been treated according to the invention, taken by SEM at a magnification of 2,000. Clearly, the surface has become very smooth and fine-textured from being coated with the organic insulating solution.

Figure 6:
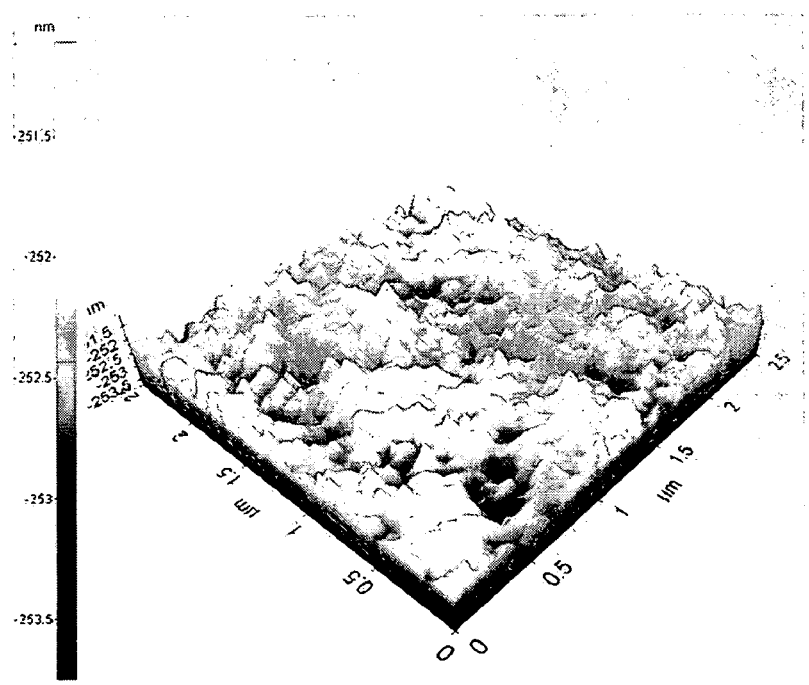
FIG. 6 is an atomic force microscopic (AFM) photograph of the surface of an FRP substrate treated according to the present invention.

FIG. 6 is an atomic force microscopic (AFM) photograph of the surface of an FRP substrate whose surface has been treated according to the invention, taken by AFM (atomic force microscopy). The rms (root mean square) roughness measures 3.15 Å, and a peak to valley distance measures 2.65 nm.

Figure 1:
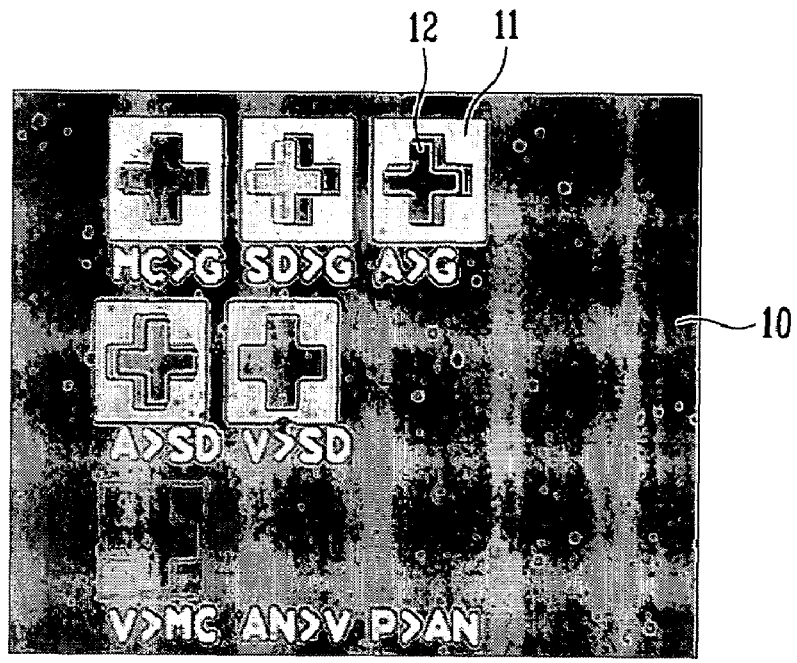
FIGS. 1 and 2 are microscopic photographs of alignment marks when a photolithography process is performed using conventional flexible substrates.
Figure 2:
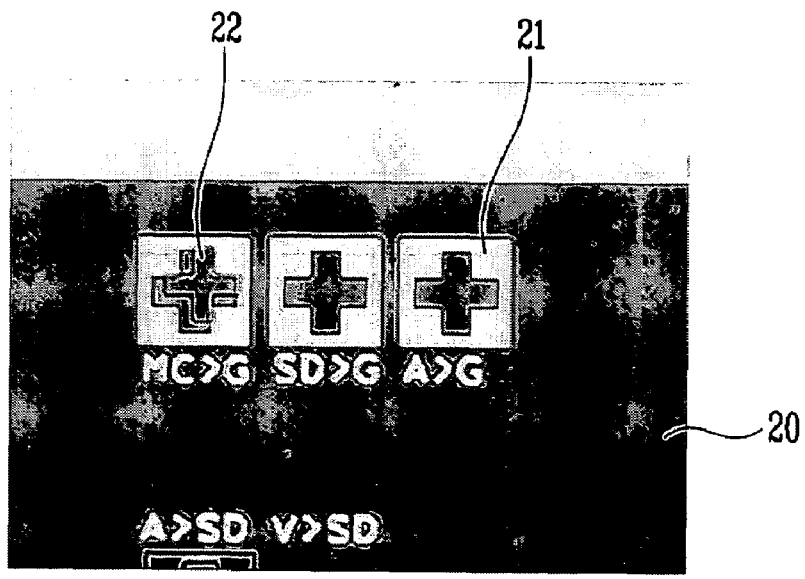
Figure 7:
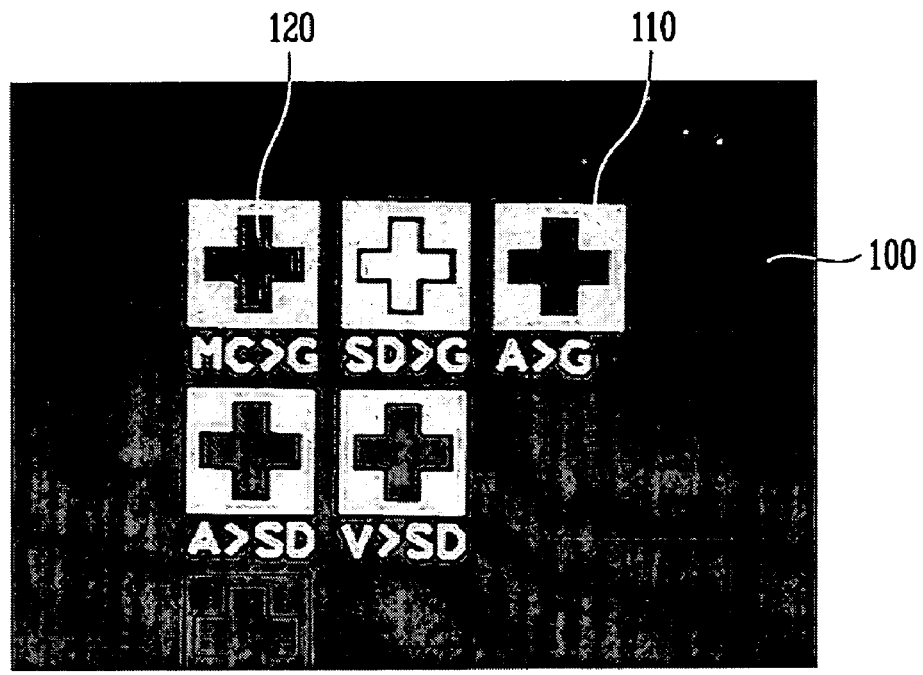
FIGS. 7 and 8 are microscopic photographs taken when a photolithography process is performed using an FRP substrate whose surface has been treated according to the present invention.
Figure 8:
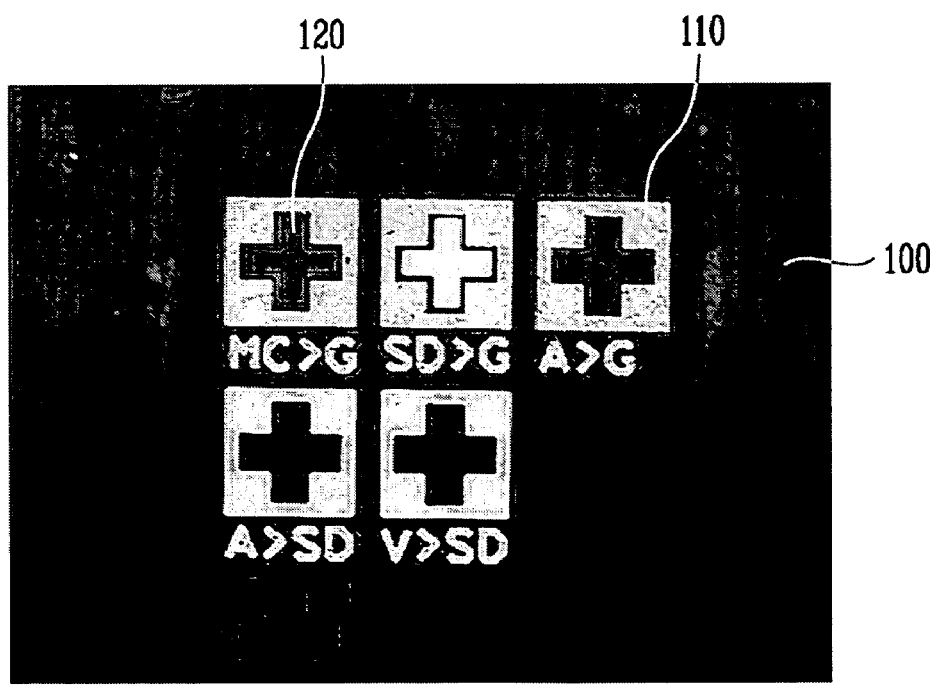

FIGS. 7 and 8 are microscopic photographs showing the state of alignment of a mask and a substrate 100 aligned using a contact aligner in a photolithography process for forming a source/drain gate contact pattern, in the case of using an FRP substrate whose surface has been treated according to the present invention. FIGS. 7 and 8 shows they are located about 2 inches apart, and a mask alignment mark 110 and a PR pattern alignment mark 120 are about 2 µm out of perfect alignment. This amount of misalignment is well within the tolerance of the contact aligner. Thus, it is confirmed that alignment is improved compared to those shown in FIGS. 1 and 2.

For example, in the case of fabricating a display emitting device, alignment should be made less than ¼ of the design rule in order for all pixels in a panel to operate normally. While there is some difference depending a cell size and structure, 2 inch QVGA panel integration is possible within 1.25 µm or less assuming a design rule of 5 µm.

Figure 9:
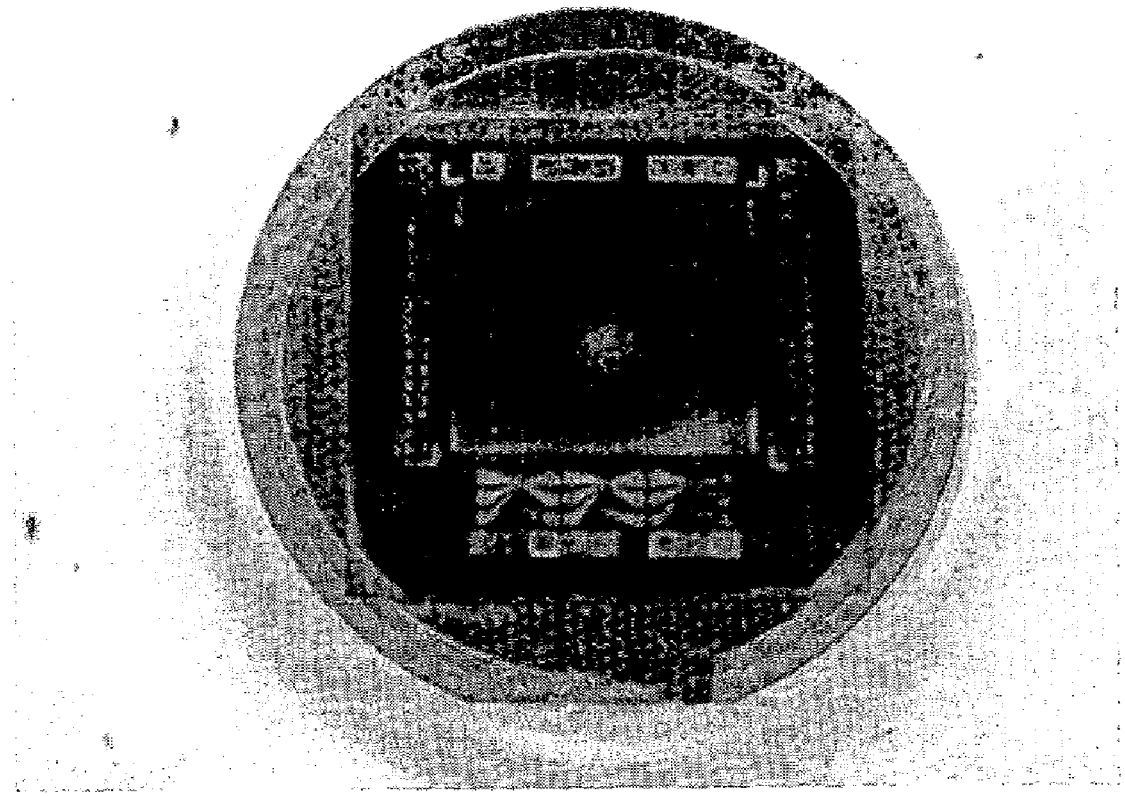
FIG. 9 is a microscopic photograph of an organic thin layer transistor made with an FRP substrate whose surface has been treated according to the present invention.

FIG. 9 is a microscopic photograph of an organic thin film transistor having a 10 µm design rule and using a 5-inch FRP substrate.

As mentioned above, the invention uses an FRP substrate that deforms less than a conventional flexible substrate material, and improves its surface smoothness in order to apply the FRP substrate to device fabrication. In the invention, the surface of the FRP substrate is smoothed by coating with an organic insulating solution. An FRP substrate whose surface treated according to the invention is flexible, less thermally deformed, and has superior surface smoothness, so that failures due to misalignment in a photolithography process may be prevented.

An FRP substrate whose surface has been treated according to the invention may be applied to the fabrication of flexible displays, flexible electronic devices, fine flexible organic electronic devices, and flexible active OLEDs using flexible organic devices as driving ICs.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A surface treatment method of an FRP substrate, comprising:
   a) cleaning the FRP substrate;
   b) removing residue from the surface of the FRP substrate;
   c) coating the FRP substrate with an organic insulating solution and planarizing the surface thereof; and
   d) baking the organic insulating solution;
   wherein step a) comprises:
   a1) cleaning the FRP substrate with a mixed solution of neutral detergent and de-ionized water;
   a2) cleaning the FRP substrate with de-ionized water and removing organic substances and particles sticking to its surface;
   a3) cleaning the FRP substrate with a mixed solution of de-ionized water and IPA and removing partially remaining organic substances and inorganic substances;
   a4) dipping the FRP substrate in IPA and removing partially remaining inorganic substances; and
   a5) drying the FRP substrate.

2. The surface treatment method of an FRP substrate according to claim 1, wherein steps a2) and a3) are performed using an ultrasonic washer.

3. The surface treatment method of an FRP substrate according to claim 1, wherein step b) comprises heat-treating in an oven for 24 to 48 hours in a vacuum and at a temperature of 100 to 180° C.

4. The surface treatment method of an FRP substrate according to claim 1, wherein step c) comprises:
   dipping the FRP substrate in an organic insulating solution; and
   lifting the FRP substrate out of the organic insulating solution at constant speed.

5. The surface treatment method of an FRP substrate according to claim 4, wherein the organic insulating solution is one selected from JSS362 and JSS361 available from JSR Company, polyester, polycarbonate, polyvinylbuterate, polyethylene, polyamide, polysulphone, polyvinylacetylene, polyacrylate and polyvinylalcohol solutions.

6. The surface treatment method of an FRP substrate according to claim 4, wherein the FRP substrate is lifted out at a speed of 0.1 to 1 mm/s.

7. The surface treatment method of an FRP substrate according to claim 1, wherein step d) comprises heat-treating in an oven for 30 minutes to 1 hour, in a vacuum and at a temperature of 100 to 180° C.

* * * * *